United States Patent
Tripathi et al.

(10) Patent No.: US 8,327,026 B1
(45) Date of Patent: Dec. 4, 2012

(54) METHOD AND SYSTEM FOR SELECTING A DATA COMPRESSION TECHNIQUE FOR DATA TRANSFER THROUGH A DATA NETWORK

(75) Inventors: Anoop Tripathi, Lake Zurich, IL (US); Ronald A. Fowler, Westford, MA (US); James Hiscock, Rockport, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1222 days.

(21) Appl. No.: 10/883,148

(22) Filed: Jul. 1, 2004

(51) Int. Cl.
  *G06F 15/16* (2006.01)
(52) U.S. Cl. ......... 709/247; 709/246; 709/248; 370/521
(58) Field of Classification Search .................. 709/248, 709/247, 246; 370/521
  See application file for complete search history.

(56) References Cited

U.S. PATENT DOCUMENTS

| | | | | |
|---|---|---|---|---|
| 5,042,028 A * | 8/1991 | Ogawa | .......................... | 370/359 |
| 5,127,003 A * | 6/1992 | Doll et al. | .................... | 370/259 |
| 5,546,395 A * | 8/1996 | Sharma et al. | ................. | 370/468 |
| 5,555,377 A | 9/1996 | Christensen et al. | .... | 395/200.11 |
| 5,600,641 A * | 2/1997 | Duault et al. | ................. | 370/400 |
| 5,617,423 A | 4/1997 | Li et al. | .......................... | 370/426 |
| 5,761,438 A * | 6/1998 | Sasaki | .......................... | 709/247 |
| 5,940,372 A * | 8/1999 | Bertin et al. | ................... | 370/238 |
| 6,118,791 A * | 9/2000 | Fichou et al. | ................... | 370/468 |
| 6,295,340 B1 * | 9/2001 | Cannon et al. | .............. | 379/88.1 |
| 6,324,409 B1 * | 11/2001 | Shaffer et al. | ............. | 455/552.1 |
| 6,490,278 B1 * | 12/2002 | Michelson et al. | .......... | 370/389 |
| 6,738,351 B1 * | 5/2004 | Qureshi et al. | ................ | 370/235 |
| 6,754,221 B1 * | 6/2004 | Whitcher et al. | ............ | 370/401 |
| 6,782,268 B1 * | 8/2004 | Thompson et al. | ........... | 455/461 |
| 6,920,107 B1 * | 7/2005 | Qureshi et al. | ................ | 370/230 |
| 7,010,727 B1 * | 3/2006 | Stucker | .......................... | 714/52 |
| 7,024,475 B1 * | 4/2006 | Abaye et al. | .................. | 709/224 |
| 7,260,080 B2 * | 8/2007 | Suumaki et al. | .............. | 370/342 |
| 7,529,192 B2 * | 5/2009 | Labovitz | ........................ | 370/236 |
| 2002/0178171 A1 * | 11/2002 | Walker et al. | ................. | 707/102 |
| 2003/0051051 A1 * | 3/2003 | O'Neal et al. | ................. | 709/242 |
| 2003/0067554 A1 * | 4/2003 | Klarfeld et al. | ............... | 348/461 |
| 2003/0095712 A1 * | 5/2003 | Christ et al. | .................. | 382/232 |
| 2003/0195861 A1 * | 10/2003 | McClure et al. | .................. | 707/1 |
| 2003/0204629 A1 * | 10/2003 | Sambandam | ................ | 709/247 |

(Continued)

OTHER PUBLICATIONS

Chandra Krintz, "Reducing Delay with Dynamic Selection of Compression Formats", Aug. 2001, Proceedings of the International Symposium on High Performing Distributed Computing (HPDC), All Pages.*

*Primary Examiner* — Djenane Bayard

(57) ABSTRACT

A method and system for selecting a data compression technique for data transfer through a data network is provided. During call setup, information is gathered from the network infrastructure by receiving feedback from smart network devices, reviewing calls logs, or by accessing a network topology database, and the information can then be used to select a desired compression technique. During a call, a media terminating end device or a call control server will monitor call connection performance specific to the data transfer pathway used for the call connection, and may adjust the data compression to conform with the performance that the connection is providing at any given moment. Performance parameters such as delay, jitter, and compression ratios can be measured in real-time for a call to determine if a change in compression is deemed beneficial. In this manner, the compression method can be chosen based on real time network performance.

26 Claims, 8 Drawing Sheets

U.S. PATENT DOCUMENTS

| | | | |
|---|---|---|---|
| 2003/0224767 A1* | 12/2003 | Futamase et al. | 455/414.1 |
| 2004/0068668 A1* | 4/2004 | Lor et al. | 713/201 |
| 2004/0103153 A1* | 5/2004 | Chang et al. | 709/206 |
| 2004/0120355 A1* | 6/2004 | Kwiatkowski | 370/506 |
| 2005/0041660 A1* | 2/2005 | Pennec et al. | 370/389 |
| 2005/0091482 A1* | 4/2005 | Gray et al. | 713/151 |
| 2005/0177750 A1* | 8/2005 | Gasparini et al. | 713/201 |
| 2005/0188112 A1* | 8/2005 | Desai et al. | 709/247 |
| 2005/0201414 A1* | 9/2005 | Awais | 370/468 |

* cited by examiner

METHOD AND SYSTEM FOR SELECTING A DATA COMPRESSION TECHNIQUE FOR DATA TRANSFER THROUGH A DATA NETWORK

FIELD OF INVENTION

The present invention relates to data transfer through IP data networks, and more particularly, to a method and system for selecting a data compression technique for data transfer through a data network.

BACKGROUND

Internet protocol ("IP") telephony and IP multimedia networks are widely used to setup and manage calls and sessions. To do so, a codec, which refers to a coder-decoder or a compression-decompression device, is generally used to convert an audio signal into a compressed digital form for transmission through the network to reduce file sizes and back into an uncompressed audio signal for play out at a media terminating device. Media terminating devices in IP Telephony (e.g., phones and gateways) support multiple types of codecs.

Codecs range from non-compressed (no loss of information) to compressed (loss of information but good quality under certain conditions). While non-compressed codecs have higher quality, they use more bandwidth compared to non-compressed codecs. In general, it is desirable to create a system that uses non-compressed codecs where bandwidth is cheap and abundant (e.g., within local area networks (LAN)) and use compressed codecs where bandwidth is costly and scarce (e.g., within wide area networks (WAN)).

Since many media terminating devices support multiple codecs, a selection technique is necessary. IP networks are usually configured to give certain codecs preference over others. For example, media terminating devices are set to have starting preferences, and upon connection, the devices use the highest priority codec that both communicating devices can support. However, using default preferences for all types of connections does not always provide a desirable connection. For example, if high compression codecs are set for top priority, then a majority of calls would suffer a loss of information even when it is unnecessary. Further, using default preferences for calls may not allow codec negotiation during a call, such as by taking into consideration network delays, time of day, or other network characteristics.

Thus, it is desirable to provide a codec selection technique that may provide an optimal data compression for each specific connection.

SUMMARY

In an example of an embodiment, a method for selecting a data compression technique for data transfer through a network between a first network device and a second network device is provided. The method includes receiving information of a configuration of the network between the first network device and the second network device. The information includes data transfer speeds through the network. The method further includes selecting a data compression technique for data transfer through the network between the first network device and the second network device based on the information. The method may be performed by a call control server residing in the network, or by the first or second network device, and the method can be performed during call setup or during a call between the first and second network device.

In one example, the first network device will determine the configuration of the network between the first network device and the second network device by identifying a data transfer path between the first network device and the second network device, and then identifying intermediary links in the data transfer path between the first network device and the second network device. The first network device can then determine data transfer capabilities of the intermediary links in the data transfer path between the first network device and the second network device to select the data compression technique for data transfer through the network to the second network device.

Many different types of information regarding the configuration of the network between the first network device and the second network device can be obtained to be used to select a data compression technique for data transfer between the first and second network devices. For example, the information may include a network topology between the first network device and the second network, information regarding intermediary links contained within a data path between the first network device and the second network device, information regarding where the first network device and the second network device are located within the network, call history information for prior calls between the first network device and the second network device, information from a smart network device including whether uncompressed data is being transferred over a slow speed link or whether compressed data is being transferred over a high speed link, performance parameters such as a packet delivery delay time in the network, a jitter time in the network, and a packet loss factor of the network, and information regarding a time of day.

In another example of an embodiment, a method for selecting a data compression technique for data transfer through a network between a first network device and a second network device is provided. The method includes transferring data in a compressed format between the first network device and the second network device through intermediary links in the network. The method also includes determining a quality of data transfer through the intermediary links in the network, and then adjusting the compressed format based on the quality of data transfer.

These as well as other features, advantages and alternatives will become apparent to those of ordinary skill in the art by reading the following detailed description, with appropriate reference to the accompanying drawings.

DETAILED DESCRIPTION OF EMBODIMENTS

In one embodiment, a method of selecting a data compression technique in an IP telephony network is provided. The method may be performed during call setup or during the call. During call setup, information can be gathered from the network infrastructure by (i) accessing network topology information from a network management database, (ii) receiving feedback from smart network devices that report if they recognize uncompressed data being transferred over a slow speed link or compressed data being transferred between two network phones known to be connected by a high speed connection, or (iii) reviewing calls logs to identify actual performance between phones, for example. The information can then be used to select a desired compression technique to be used for data transfer through the network.

During a call, a media terminating end device, e.g., network telephone, or a call control server will monitor call connection performance and may adjust the data compression to conform with the performance that the connection is providing at any given moment. For example, performance parameters such as delay, jitter, and compression ratios can be measured in real time for a call to determine if a change in compression is deemed beneficial. If so, the phone may send a request to a device on the other end of the connection to request a change in the compression. In this manner, the compression method is chosen based on real time network performance.

Figure 1:
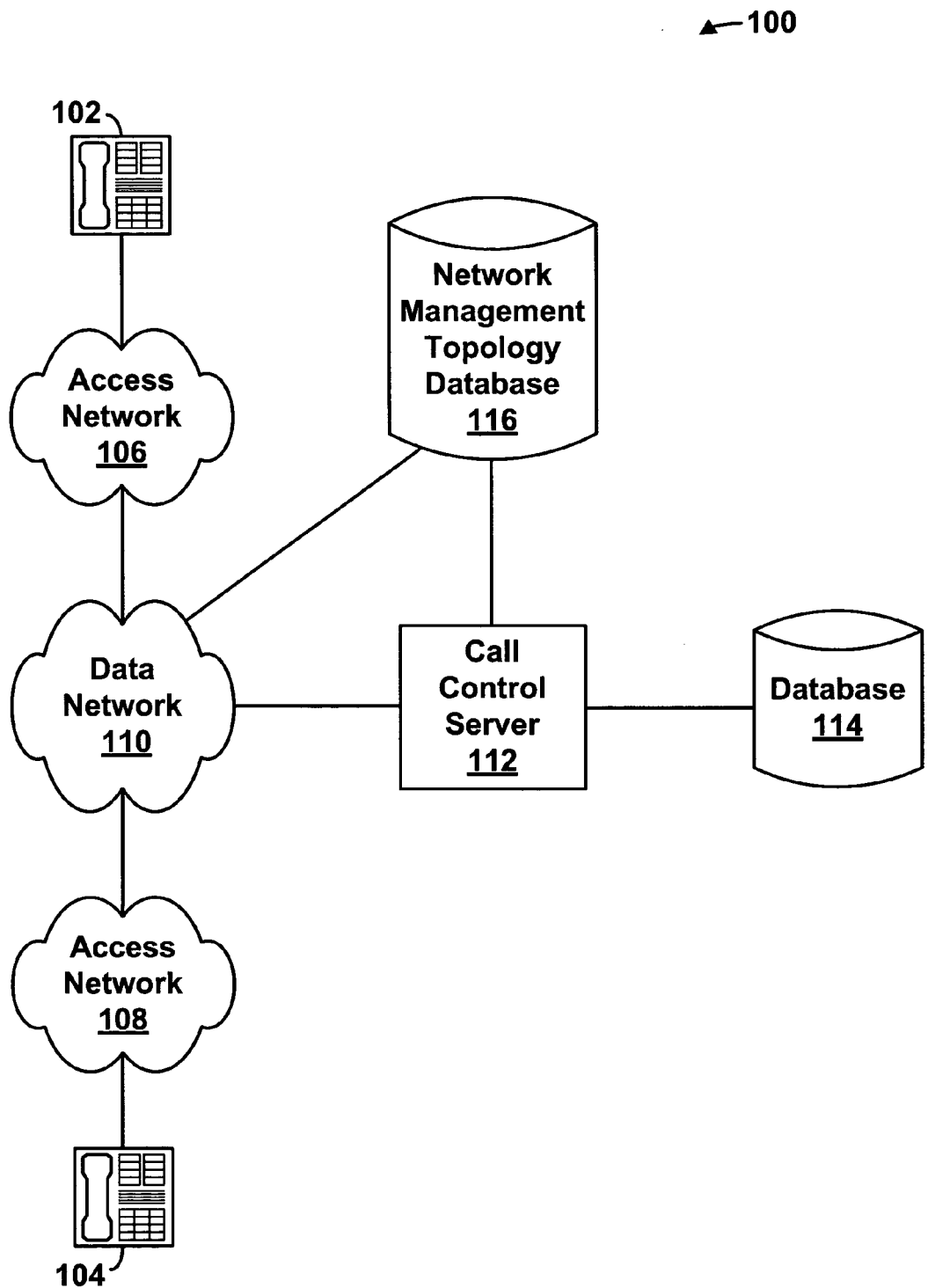
FIG. 1 is a block diagram of one embodiment of a network telephony system.

Referring now to the figures, and more particularly to FIG. 1, a block diagram of one embodiment of a network telephony system 100 is illustrated. It should be understood that the system 100 illustrated in FIG. 1 and other arrangements described herein are set forth for purposes of example only, and other arrangements and elements can be used instead and some elements may be omitted altogether, depending, for example, on manufacturing and/or consumer preferences.

The system 100 includes media terminating devices 102 and 104 coupled to a data network 110 through access networks 106 and 108. The media terminating devices 102 and 104 are shown to be IP network phones. However, the media terminating devices 102 and 104 may be any network device such as personal computers with user interface hardware like a microphone and headphone to communicate voice information, a personal digital assistant (PDA) with voice communication capabilities, or other communication devices. In addition, more media terminating devices may be included in the system 100.

The access networks 106 and 108 may be any type of networks that connect the media terminating devices 102 and 104 to the data network 110. For example, the access networks 106 and 108 may be local area networks (LAN) whether wired or wireless, or others, and the link between the media terminating devices 102 and 104 and the access networks 106 and 108 may be wired or wireless as well. The data network 110 may be a LAN, a WAN, or generally a data packet network such as an Internet Protocol (IP) network. The data network 110 interconnects the access networks 106 and 108 could also be a virtual private network (VPN) or the Internet, a lease line of a corporate network, or a campus backbone network, for example. The media terminating devices 102 and 104 may communicate with each other or with other through the data network 110.

The data network 110 also couples to a call control server 112. The call control server 112 establishes and monitors data transfer between the media terminating devices 102 and 104. The call control server 112 will receive call setup messages from the media terminating devices 102 and 104 when the devices initiate a call. In addition, during a call between the media terminating devices 102 and 104, the call control server 112 may receive reporting messages from the devices that include data transfer statistics for the call. Thus, the call control server 112 observes operation of the media terminating devices 102 and 104 based on messages received from the devices.

The call control server is connected to a database 114. The database 114 stores general information concerning the system 100, and specific information concerning past performance of the system 100. For example, the database 114 may include a call log detailing specific data transfer rates between network devices residing on the data network 110 for calls between the network devices. The database 114 may also include information relating to bandwidth capabilities of the data network 104 and/or bandwidth capabilities of network equipment within the data network 110. The database 114 may further include a table of all network devices residing on the data network 110 that are registered with the data network 110 and the network devices' associated IP addresses.

The system 100 may also include a network management topology database 116 coupled to the call control server 112 and the data network 110. The database 116 includes information pertaining to a topology of the system 100, such as data paths between network devices in the system 100. For example, the database 116 may contain a table that includes possible data transfer paths between any two network devices residing in the system. The data transfer path information may include all intermediary links between two network devices. Alternatively, the database 116 may include information pertaining to all the links within the system 100, and how the links are interconnected such that the call control server 112 could determine data transfer pathways between network devices using this information. Thus, the call control server 112 or media terminating devices 102 and 104 may then access the database 116 to identify the intermediary data transfer links between the media terminating devices 102 and 104.

The database 116 may include any third party network management tool that includes network mapping capabilities, such as HP OpenView® available from the Hewlett-Packard Company or IBM Tivoli NetView. The media terminating devices 102 and 104 and the call control server 112 can access the database 116 to identify a data transfer path between the media terminating devices 102 and 104, determine the slowest link in the path (e.g., possibly based on data transfer speeds and available bandwidth of the link), and adjust data transfer accordingly.

Figure 2:
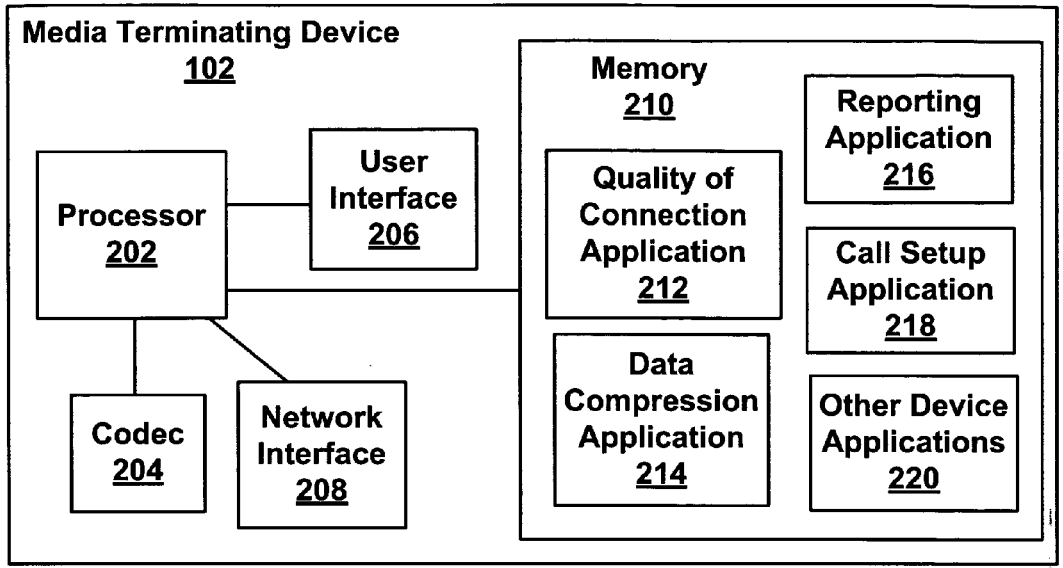
FIG. 2 is a block diagram of one embodiment of a media terminating device.
Figure 3:
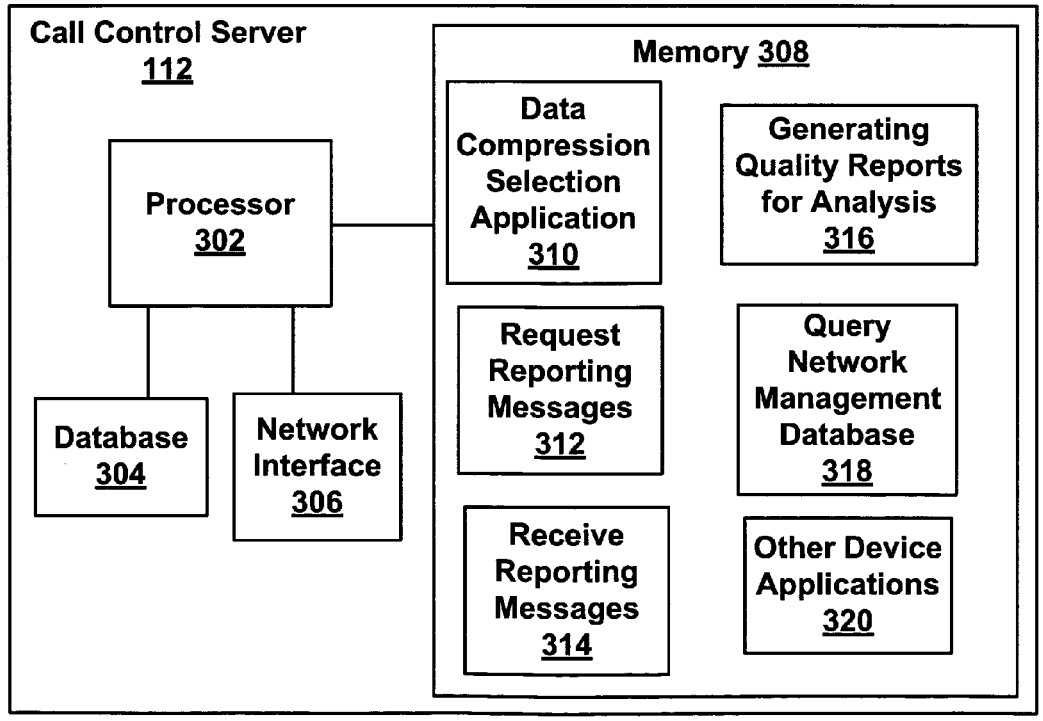
FIG. 3 is a block diagram of one embodiment of a call control server.

FIGS. 2 and 3 are block diagrams that illustrate an exemplary media terminating device 102 and an exemplary call control server 112. It should be understood that these and other arrangements described herein are set forth for purposes of example only, and other arrangements and elements can be used instead and some elements may be omitted altogether. Further, many of the elements described herein are functional entities that may be implemented as hardware, firmware, or software, and as discrete components or in conjunction with other components, in any suitable combination and location.

As shown in FIG. 2, the media terminating device 102 includes a processor 202, a codec 204, a user interface 206, a network interface 208, and memory 210. The memory 210 includes a number of applications executable by the processor 202. The applications may be in the form of executable instructions accessible by the processor 204 to perform specific tasks. In addition, some of the applications can be implemented fully or in part through application logic hardware. The applications include a quality of connection application 212 executable to determine performance statistics related to a call connection, a data compression application 214 executable to select a desired data compression technique, a reporting application 216 executable to send messages to the call control server 112 including information relating to statistics of a call connection, a call setup application 218 executable to initiate a call with another network device, and other device applications 220 such as conference call functions, phone number storage and retrieval, etc. The media terminating device 102 may include other applications as well.

As shown in FIG. 3, the call control server 112 includes a processor 302, a database 304, a network interface 306, and memory 308. The memory includes a number of applications executable by the processor 302. The applications may be in the form of executable instructions accessible by the processor 302 to perform specific tasks. The applications include a data compression selection application 310 executable to select a data compression technique, a request reporting messages application 312 executable to request messages from the media terminating devices 102 and 104, a receive reporting messages application 314 executable to receive messages from the media terminating devices 102 and 104, a quality report application 316 executable to generate a quality report of data transfer between network devices, a query database application 318 executable to query the network management database 116, and other device applications 320 such as network management applications, voice mail, hold music, etc. The call control server 112 may include other applications as well.

To conserve bandwidth in the system 100, media terminating devices can transfer data in a compressed format. To compress multimedia data, a codec is generally used to convert an audio signal into a compressed digital form for transmission through the network to reduce file sizes and back into an uncompressed audio signal for play out at a media terminating device.

Data may be compressed using any standard compression algorithm or technique. Some examples include G.711, G.726 or G.729. G.711 is described in "Pulse Code Modulation of Voice Frequencies," ITU-T Recommendation G.711, G.726 is described in "40, 32, 24, 16 kbit/s Adaptive Differential Pulse Code Modulation (ADPCM)," ITU-T Recommendation G.726, and G.729 is described in "Coding of Speech at 8 kbit/s using Conjugate-Structure Algebraic-Code-Excited Linear-Prediction (CS-ACELP)," ITU-T Recommendation G.729. ITU-T Recommendations G.711, G.726 and G.729 are each incorporated by reference herein as if fully set forth in this description. These are examples only, since many other compression techniques exist as well. Further, higher bandwidth audio requirements may arise for certain types of data packets, and in such cases, other specialized data compression techniques can be developed.

G.711 data compression can be used for low compression techniques or in instances where bandwidth is plentiful. For example, telephone companies transmit voice at minimal compression levels such as at 64 kbit/s using G.711 for high quality data transmission due to the availability of high bandwidth data transfer links. G.729 data compression can be used for heavy compression techniques or in instances where bandwidth is scarce. For example, using G.729, data is compressed and transferred at 8 kbit/s, which is an 8:1 data compression, and the quality of data transmission is less than G.711 due to loss of data. As another example, G.726 data compression can be used to compress data to sizes in between those offered by G.711 and G.729. G.726 is an intermediate data compression technique that is used to compress data to 32 kbit/s, which is a 2:1 data compression and results in a low loss in quality of the data.

As such, many types of codecs may be used within network devices depending on the type of data being compressed and transferred. Thus, the media terminating devices 102 and 104 may support multiple types of codecs and multiple types of data compression techniques.

Figure 4:
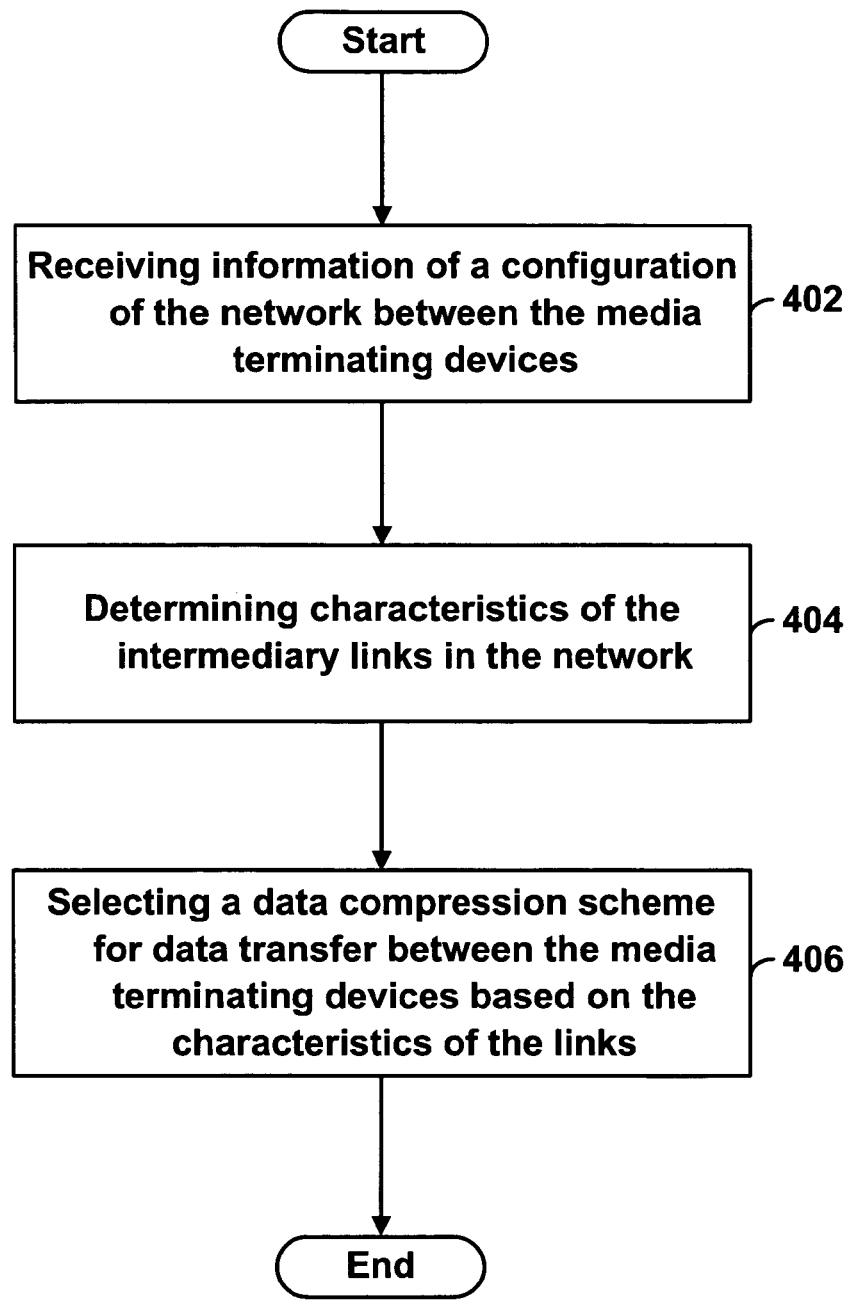
FIG. 4 is a flowchart depicting one embodiment of a method for selecting a data compression technique for data transfer through a network.

In one embodiment, the media terminating devices 102 and 104 or the call control server 112 may select a data compression technique for data transfer between network devices residing in the system 100 based on the topology of the system 100. FIG. 4 is a flowchart depicting one embodiment of a method for selecting the data compression technique. Initially, the media terminating devices 102 and 104 or the call control server 112 will receive information of a configuration of the network between the media terminating devices 102 and 104, as shown at block 402. For example, information concerning links that transfer data between the devices 102 and 104, such as the types and number of access networks used, can be requested from the network management topology database 116. The database 116 can then send such information to the call control server 112 directly, or to the media terminating devices 102 and 104 through the data network 110.

Next, the media terminating devices 102 and 104 or the call control server 112 will determine characteristics of the intermediary links in the network from the information received, as shown at block 404. Intermediary links of interest may be those contained within a data path between the media terminating devices 102 and 104. For example, data rates and available bandwidth of access networks can be identified based on the types of access networks used. Other characteristics can be identified as well, such as packet loss and packet delay resulting from data packet transfer through the intermediary links.

Following, the media terminating devices 102 and 104 or the call control server 112 will select a data compression technique for data transfer between the media terminating devices 102 and 104 based on the characteristics of the links, as shown at block 406. For example, the data compression technique may be selected based on total available bandwidth, an instantaneous available bandwidth, or administration control of bandwidth. Thus, as an example, if a slowest link along a data transfer path has the ability to transfer data at 64 kbit/s, then a high compression technique can be used, such as the G.729 compression technique (e.g., 8 kbit/s), such that the bandwidth on the slowest link will not be exhausted for one phone call.

As another example, if the slowest link in a data transfer path is a T1 link (e.g., 1.5 mbit/s) into a data network, then the G.711 data compression may be chosen since there is ample bandwidth available. A T1 data link can be used to transfer data between devices residing on a WAN. However, in such a case, administrative controls may be set to further conserve bandwidth and to dedicate this link as a compressed link. In this case, a data compression technique is selected based on available bandwidth and the administrative settings.

The method described in FIG. 4 for data compression technique selection may be performed during a call setup between network devices, or during a call between network devices. A call or data connection between two network devices can be established using any IP based call signaling.

In one example embodiment, a call is setup and performed using the Session Initiation Protocol (SIP) signaling protocol. SIP is described in Handley, et al., "SIP: Session Initiation Protocol," IETF (RFC) 2543, March 1999, which is entirely incorporated by reference herein, as if fully set forth in this description. The SIP is also described in Rosenberg et al., "SIP: Session Initiation Protocol," IETF (RFC) 3261, June 2002, the contents of which are entirely incorporated herein by reference, as if fully set forth in this description. Other signaling protocols, such as H-323, MGCP, MEGACO, and other standard or proprietary techniques may alternatively be used.

The SIP protocol is a text-based protocol in which one party sends a message in American standard code for information interchange (ASCII) text consisting of a method name on the first line, followed by additional lines containing headers for passing parameters. Many of the headers are taken from multipurpose Internet mail extensions (MIME) to allow SIP to interwork with existing Internet applications.

As an example, consider the following exemplary text encoded message.

```
INVITE sip:user@biloxi.com SIP/2.0
Via: SIP/2.0/UDP pc33.atlanta.com;branch=z9hG4bK776asdhds
Max-Forwards: 70
To: User <sip:user@biloxi.com>
From: Sender <sip:sender@atlanta.com>;tag=1928301774
Call-ID: a84b4c76e66710@pc33.atlanta.com
CSeq: 314159 INVITE
Contact: <sip:sender@pc33.atlanta.com>
Content-Type: application/sdp
Content-Length: 142
```

The first line of this text-encoded message contains the method name (e.g., INVITE). The lines that follow are a list of header fields. For example, the fields Via (describing the address at which the user is expecting to receive responses), To (contains a display name or SIP request-URI towards which the request was originally directed), From (contains a display name and a SIP request-URI that indicate the originator of the request), Call-ID (contains a globally unique identifier for this call), CSeq (a traditional sequence number), and Contact (contains a SIP request-URI that represents a direct route to contact the sender) are header fields. In addition, the From header also has a tag parameter containing a random string (e.g., 1928301774) that used for identification purposes.

Other example methods are provided below in Table 1.

TABLE 1

| METHOD | DESCRIPTION |
| --- | --- |
| INVITE | Request initiation of a session |
| ACK | Confirm that a session has been initiated |
| BYE | Request termination of a session |
| OPTIONS | Query a host about its capabilities |
| CANCEL | Cancel a pending request |
| REGISTER | Inform a redirection server about the user's current location |

Using the methods in Table 1, many types of SIP call flows can be performed, such as those described in RFC 3665, entitled "Session Initiation Protocol (SIP) Basic Call Flow Examples," which is entirely incorporated by reference as if fully set forth in this description. As one example, to initiate a call, the media terminating device 102 ("the caller") sends an INVITE message to the media terminating device 104 ("the callee") by way of the access network 108. The transport protocol for the transmission may be transmission control protocol (TCP) or user datagram protocol (UDP), for example. In both cases, the headers on the second and subsequent lines of INVITE message describe the structure of the message body, which contains the caller's capabilities, media types, and formats. The INVITE message also contains a user identifier to identify the callee, a caller user identifier to identify the caller, and a session description that informs the called party what type of media the caller can accept and where the caller wishes the media data to be sent. User identifiers in SIP requests are known as SIP addresses. SIP addresses are referred to as SIP Universal Resource Indicators (SIP request-URIs), which are of the form sip:user@host.domain. Other addressing conventions may also be used.

The access network 108 locates the callee and transmits an INVITE request to the callee. The INVITE request may simply be a forwarded version of the INVITE request, containing the SIP addresses of the caller and the callee. Upon receiving the INVITE request, the callee may transmit a response message to the access network 108. The access network 108 may then transmit a response message back to the caller. The response messages may be reply codes. A reply code may be a three-digit number with a classification as defined below in Table 2.

TABLE 2

| CODE | MEANING | EXAMPLES |
| --- | --- | --- |
| 1xx | Information | 100 = server agrees to handle client's request |
| 2xx | Success | 200 = request succeeded |
| 3xx | Redirection | 301 = page moved |
| 4xx | Client Error | 403 = forbidden page |
| 5xx | Server Error | 500 = internal server error |

For example, if the callee accepts the call, the callee responds with a 200 OK message. Following the reply code line, the callee also may supply information about the callee's capabilities, media types, and formats.

If the transmitted response message is a success response (i.e., represented by a SIP "200 OK" response), then the caller may send an ACK message back to the callee to confirm receipt of the 200 OK message and complete the call initiation process. The ACK message may be sent through the same path as the INVITE request and response messages. After the call has been initiated using the SIP signaling protocol, the call is connected and media data (including voice information, etc.) can flow on a data channel between the media terminating devices 102 and 104.

Selecting Data Compression Technique During Call Setup

In one embodiment, the media terminating devices 102 and 104 or the call control server 112 will select a data compression technique for data transfer during call setup. A call or data connection between two network devices can be carried out using any standard IP telephony protocol, such as Session Initiation Protocol (SIP), the H.323 protocol, the Media Gateway Control Protocol (MGCP), the Media Gateway Control Protocol (MEGACO), and other standard or proprietary protocols may alternatively be used. In an example embodiment, the call connection is performed using the SIP signaling protocol. During call setup, the network management topology database 116 can be accessed by the media terminating devices 102 and 104 through the data network 110, or directly by the call control server 112, to receive information about the system's infrastructure. Subsequently, a data compression technique can be chosen according to the network topology between a source and destination media network device.

Figure 5:
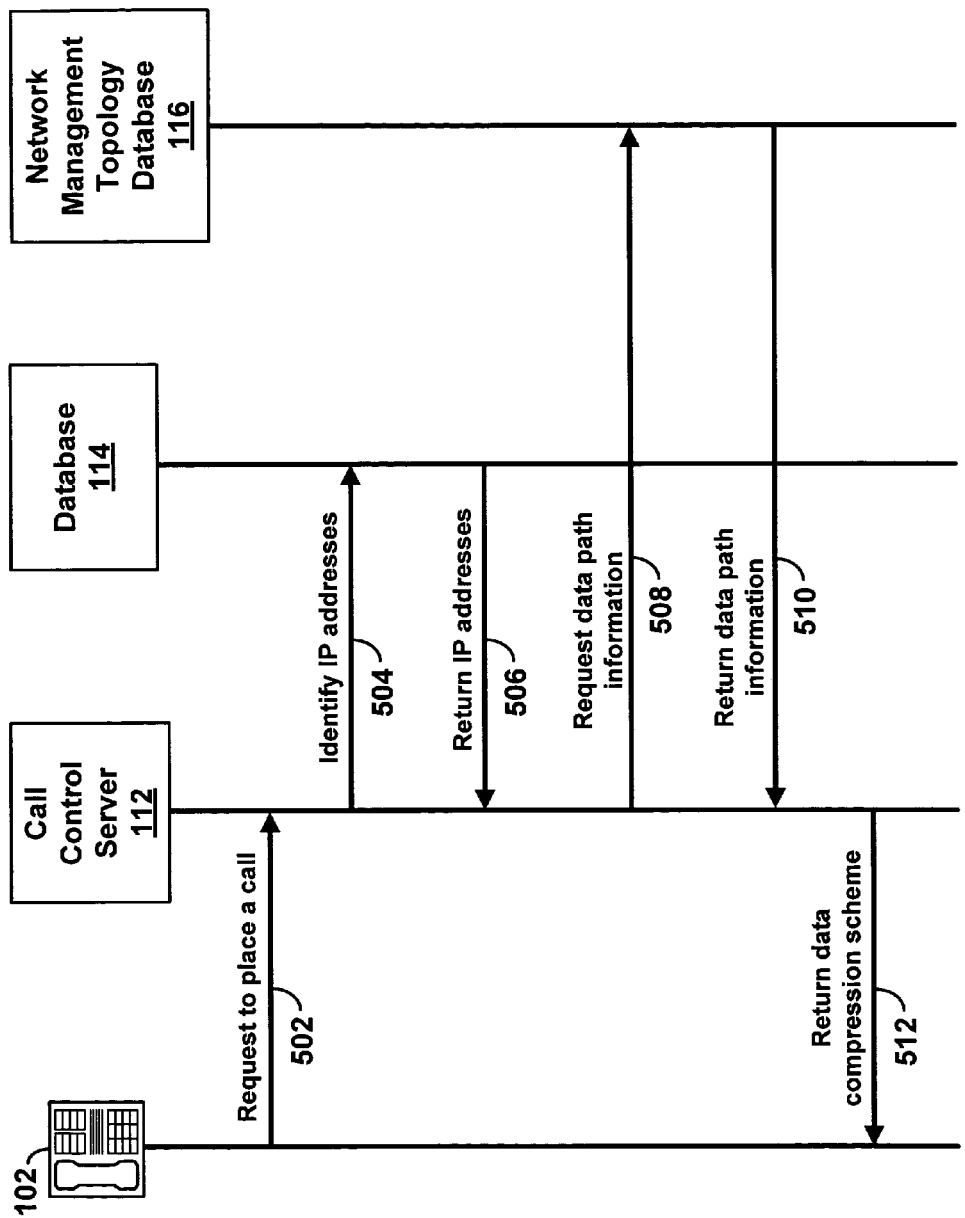
FIG. 5 is a message flow diagram illustrating one embodiment of selecting a data compression technique during call setup.

As one example, FIG. 5 is a message flow diagram illustrating one embodiment of signaling to select a data compression technique during call setup. Initially, a network device, such as media terminating device 102, will send a message to the call control server 112 to request to place a call, as shown at message 502. The media terminating device 102 may request to place a call to media terminating device 104, for example. The message may be a SIP INVITE message that is used to initiate a real time protocol (RTP) media session as described above.

The call control server 112 will then identify IP addresses of the media terminating devices 102 and 104, as shown at message 504, to initiate the call. The call control server 112 will identify the IP addresses by querying the database 114, for example, and the database will return the IP addresses, as shown at message 506. (Alternatively, the call control server 112 may identify the IF addresses from information included within the SIP INVITE message). Next, the call control server 112 will request data path information from the network management topology database 116, as shown at message 508. For example, the call control server 112 will request the network management topology database 116 to identify where the media terminating devices 102 and 104 are located and any intermediary links that are contained within a data transfer path between the media terminating devices 102 and 104. In response, the network management topology database 116 will identify the data path information using the IP addresses of the media terminating devices 102 and 104 using any standard network mapping algorithm, and return the data path information to the call control server 112, as shown at message 510.

The call control server 112 will use the data path information to determine a data compression technique that the media terminating devices 102 and 104 will use for the call. Thus, the call control server 112 will return the data compression technique to the media terminating device 102, as shown at message 512. The call control server 112 may also send a message indicating the data compression technique to the media terminating device 104. The call between the media terminating devices 102 and 104 may then begin and data will be transferred between the devices in the selected compressed format.

Many methods exist for selecting the data compression technique based on network topology information. Some examples are listed below. However, it should be understood that these are exemplary only, since many other techniques for selecting a data compression technique based on network topology information exist.

Identifying Intermediary Links

In one embodiment, the call control server 112 or the media terminating devices 102 and 104 will determine the data compression technique by identifying any intermediary links within the data transfer path and determining maximum data transfer speeds through these links. The call control server 112 or the media terminating devices 102 and 104 may identify any intermediary links within the data transfer path by accessing the network management topology database 116 using the simple network management protocol (SNMP). The call control server 112 or the media terminating devices 102 and 104 could read the network topology information, and using this information find where media terminating devices are located in the network topology, and then traverse the network topology from one media terminating device to the other, noting each link between the devices and each link's capabilities. For example, the media terminating device 102 could access the database 116 through access network 106 and data network 110 and retrieve information corresponding to the network topology present between itself and the media terminating device 104. The media terminating device 102 could then determine that access networks 106 and 108 and data network 110 comprise the links between media terminating devices 102 and 104.

In addition, the call control server 112 or the media terminating devices 102 and 104 may identify any intermediary links within the data transfer path by sending the network management topology database 116 the two IP addresses of the communicating devices (e.g., as obtained from the SIP INVITE call setup messages) and the network management topology database 116 would return a description of the data path between the two IP addresses. The returned information may contain intermediary link capabilities in the data path description, or the call control server 112 or media terminating devices may need to do further inquiries to the network management topology database 116 about the capabilities of each link in the data path description.

After analyzing all intermediary links, the call control server 112 or the media terminating devices will identify the slowest transfer speed of any link within a data path, and select a data compression technique to be used based on the slowest link's limitations. For example, if an intermediary link is a LAN, the call control server 112 will estimate data transfer speeds of 10, 100, 1000 or 10000 megabits per second and accordingly select a data compression technique that can accommodate the available bandwidth.

As other examples, the G.729 data compression may be used for data transfer when 64 kbit/s or less bandwidth is available, and no data compression may be used when 10 mbit/s or more is available (e.g., as may be available when transferring data through a LAN). When transferring data through links with available bandwidth ranging from 64 kbit/s to 10 mbit/s (e.g., such as when using a T1 data link that provides 1.5 mbit/s), network administrators may choose to manage the available bandwidth by using the G.729 or G.726 data compression. Usually, network administrators will utilize some type of data compression when bandwidth falls below 64 kbit/s.

Identifying Subnet Information

Figure 6:
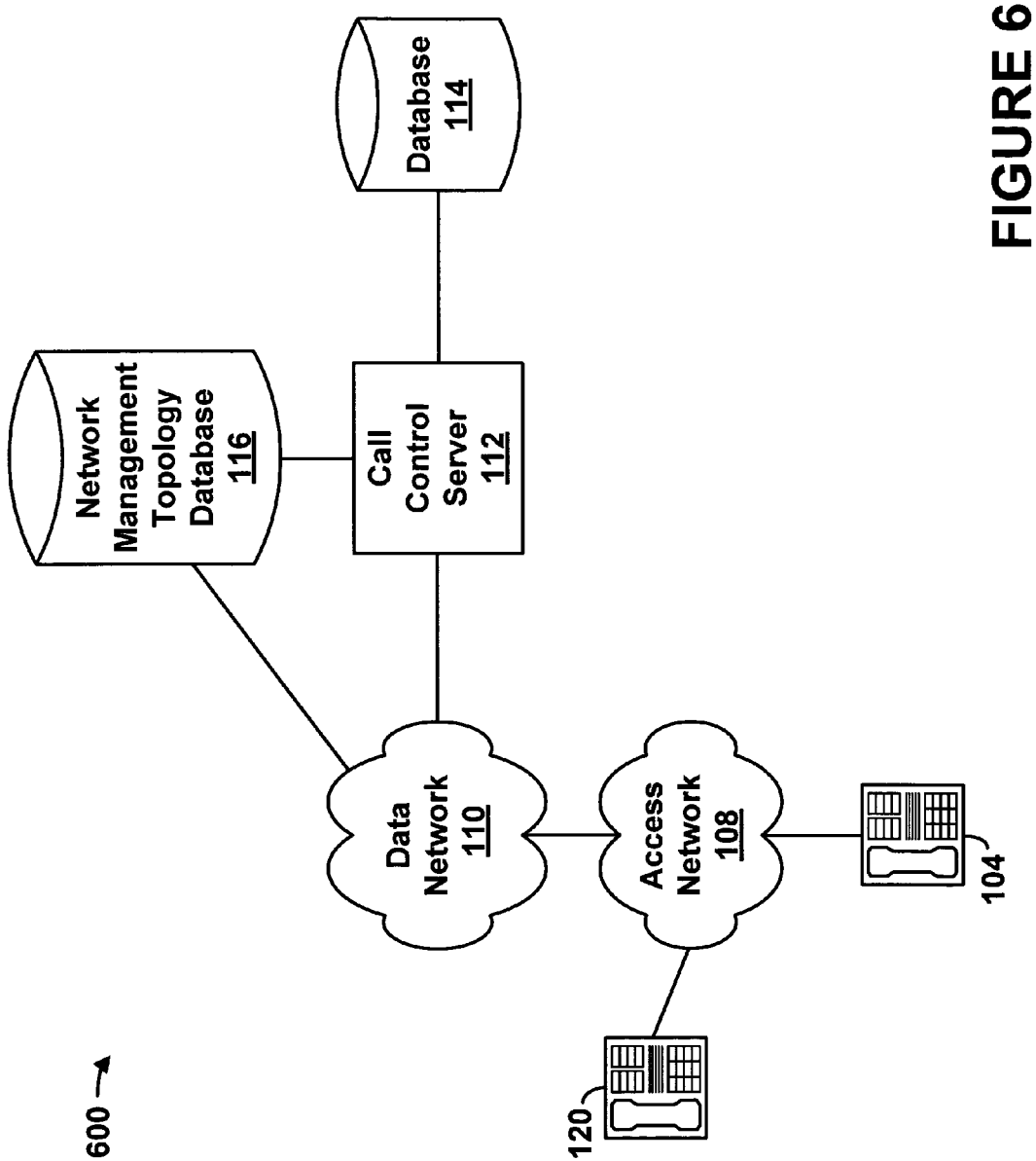
FIG. 6 illustrates one example of a system including media terminating devices located on the same access network.

In another embodiment, the call control server 112 or the media terminating devices may determine the data compression speed by determining the subnet where the media terminating devices 102 and 104 reside based on their IP addresses, and then determine a data transfer speed of that type of subnet. For example, if both the media terminating devices 102 and 104 are located on the same LAN, then a low data compression technique could be selected. FIG. 6 illustrates one example of a system 600 including media terminating devices 104 and 120 located on the same access network 108. Thus, data transfer between the media terminating devices 104 and 120 does not need to traverse through the data network 104. As a result, data transfer rates may be high, and a low compression technique may then be selected so that little or no loss of data results from the transfer of data from one media terminating device to another.

The call control server 112 may determine where the media terminating devices 102 and 104 are located by accessing the database 114 and performing a lookup using the IP addresses of the media terminating devices 102 and 104. The database 114 may contain such information based on registration of the media terminating devices 102 and 104 with the data network.

In addition, the media terminating devices 102 and 104 may determine if they reside on the same subnet during call setup. For example, during call setup, the media terminating devices 102 and 104 could exchange SIP INVITE messages through the access network 108 to establish a call. As a specific example, if media terminating device 102 sent the SIP INVITE message shown below to media terminating device 104, then media terminating device 104 could determine that it resides on the same network as media terminating device 102 because the header fields "To" (e.g., contains a display name or SIP request-URI towards which the request was originally directed), and "From" (e.g., contains a display name and a SIP request-URI that indicate the originator of the request) include SIP network addresses with the same domain.

```
INVITE sip:user@chicago.com SIP/2.0
Via: SIP/2.0/UDP pc33.chicago.com;branch=z9hG4bK776asdhds
Max-Forwards: 70
To: User <sip:user@chicago.com>
From: Sender <sip:sender@chicago.com>;tag=1928301774
Call-ID: a84b4c76e66710@pc33.chicago.com
CSeq: 314159 INVITE
Contact: <sip:sender@pc33.chicago.com>
Content-Type: application/sdp
Content-Length: 142
```

In example above, the call is established without signaling through the call control server 112. Thus, the media terminating devices 102 and 104 can determine a data compression technique during call setup on their own by identifying if they reside on the same subnet. If so, the devices can transfer data uncompressed due to the availability of bandwidth.

Call History Information

In still another embodiment, information concerning prior calls through the system 100 is used to select a data compression technique. For example, information regarding calls through the system 100 can be periodically gathered to build a call log or source/destination link table. Such information may include data transfer rates of calls for specific data pathways. The call log and source/destination link tables may be included within the database 114. Thus, when a network device requests initiation of a call, the call control server 112 (or the network devices) could access the source/destination table in the database 114 to determine an available data pathway for data transfer to the network device to which he requests to call. In addition, the call control server 112 could alternatively query a device, (e.g., a third party network management application designed for voice environments that gathers statistics about network performance and call quality), that provides the service of looking into call logs and responding to a query concerning a source/destination subnet or address pair to provide a data transfer rate of a preferred data pathway. Thus, the call control server 112 would be reviewing calls logs to identify past data transfer rates between network devices.

An example call log table is shown below in Table 3.

TABLE 3

|  | Network Device A | Network Device B | Network Device C |
| --- | --- | --- | --- |
| Network Device D | Packet Loss: 2%<br>Packet Jitter:<br>50 ms | Packet Loss: 2%<br>Packet Jitter:<br>20 ms | Packet Loss: 1%<br>Packet Jitter:<br>10 ms |

TABLE 3-continued

|  | Network Device A | Network Device B | Network Device C |
| --- | --- | --- | --- |
| Network Device E | Packet Delay:<br>100 ms<br>Packet Loss: 3%<br>Packet Jitter:<br>30 ms | Packet Delay:<br>50 ms<br>Packet Loss: 2%<br>Packet Jitter:<br>50 ms | Packet Delay:<br>10 ms<br>Packet Loss: 2%<br>Packet Jitter:<br>5 ms |
| Network Device G | Packet Delay:<br>500 ms<br>Packet Loss: 0.5%<br>Packet Jitter:<br>10 ms<br>Packet Delay:<br>10 ms | Packet Delay:<br>100 ms<br>Packet Loss: 1.2%<br>Packet Jitter:<br>15 ms<br>Packet Delay:<br>20 ms | Packet Delay:<br>10 ms<br>Packet Loss: 1%<br>Packet Jitter:<br>5 ms<br>Packet Delay:<br>10 ms |

Table 3 indicates call statistics for previous calls between the specified network devices. The call statistics include packet loss, packet jitter and packet delay. For example, for previous calls from network device D to network device A, the packet loss has been measured to be 2%, the packet jitter has been measured to be 50 ms and the packet delay has been measured to be 100 ms. These measurements may be the average measurement of such characteristics over a period of time, or the measurements may correspond to statistics at a particular time of the day. The statistics can be compiled in other manners as well.

The statistics in the call log table can be used to select a data compression technique during call setup that will be used for data transfer between network devices. For example, if the packet loss is more than a few percent, this may indicate that this data transfer pathway is overloaded, and thus data transfer for a new call should be compressed. Further, if the packet jitter or the packet delay is as high as about 50-100 ms, then again the data transfer pathway may be heavily loaded, and thus data should be compressed accordingly for calls between these devices.

An example source/destination or data pathway table is shown below in Table 4.

TABLE 4

|  | Network Device A | Network Device B | Network Device C |
| --- | --- | --- | --- |
| Network Device D | Bandwidth:<br>1.5 mbit/s<br>Time: 6:00 am<br>.<br>.<br>Bandwidth:<br>1.2 mbit/s<br>Time: 7:00am<br>. | Bandwidth:<br>1.5 mbit/s<br>Time: 6:00 am<br>.<br>.<br>.<br>. | Bandwidth:<br>10 mbit/s<br>Time: 6:00 am<br>.<br>.<br>.<br>. |
| Network Device E | Bandwidth:<br>64 kbit/s<br>Time: 6:00 am<br>.<br>. | Bandwidth:<br>1.5 mbit/s<br>Time: 6:00 am<br>.<br>. | Bandwidth:<br>64 kbit/s<br>Time: 6:00 am<br>.<br>. |
| Network Device G | Bandwidth:<br>10 mbit/s<br>Time: 6:00 am<br>.<br>. | Bandwidth:<br>64 kbit/s<br>Time: 6:00 am<br>.<br>. | Bandwidth:<br>64 kbit/s<br>Time: 6:00 am<br>.<br>. |

Table 4 illustrates limiting factors for data transfer between network devices. For instance, Table 4 includes available bandwidth within a data transfer pathway between network devices at specific times during the day. A data transfer pathway may include may network components or access networks. The information included in Table 4 corresponds to the slowest data transfer link between the two communicating network devices. As one example, the data transfer pathway between network device A and D includes a slowest link with an available bandwidth of 1.5 mbit/s at 6:00 am, but only 1.2 mbit/s at 7:00 am. Bandwidth will decrease as more users attempt to transfer data. As a result, at peak times during a day, the available bandwidth will be at a minimum. Table 4 may take other forms as well. That shown above is only one example.

The information in Table 4 can be used to select a data compression technique. For example, at 6:00 am, the average bandwidth available for a data transfer pathway between network device A and network device D is 1.5 mbit/s, and thus the G.711 compression technique could be selected for low data compression.

Other Characteristics

In other embodiments, the call control server 112 may select a data compression technique based on other system characteristics as well (in addition to or rather than previously described information). For example, the time of day can be taken into account when selecting a data compression technique because usually system performance is slower or faster at certain times of the day. Other characteristics may also be considered.

Selecting Data Compression Technique During a Call

In another example embodiment, the media terminating devices 102 and 104 or the call control server 112 may select a data compression technique for data transfer during a call. For example, the call control server 112 or the network devices can periodically (or on demand), adjust the data compression rates being used in a call to better accommodate system capabilities during the call.

Figure 7:
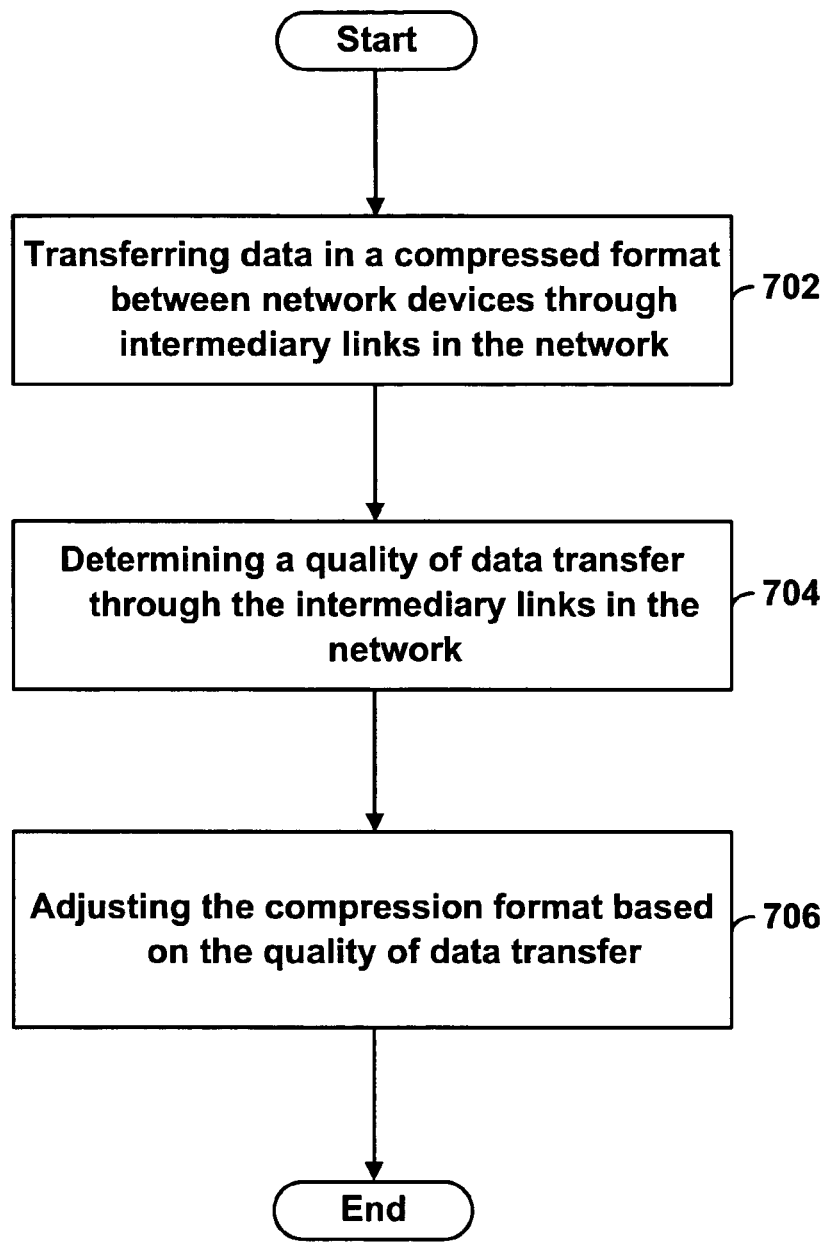
FIG. 7 is a flowchart depicting another embodiment of a method for selecting a data compression technique for data transfer through a network.

FIG. 7 is a flowchart depicting another embodiment of a method for selecting a data compression technique for data transfer through a network. Using the system 100 illustrated in FIG. 1 as an example, initially, the media terminating device 102 will be in a call session with the media terminating device 104 and the two network devices will transfer data between each other in a compressed format, as shown at block 702.

The media terminating devices 102 and 104 will measure the quality of the call, as shown at block 704. Alternatively, the media terminating devices 102 and 104 can measure the quality of the call and send a reporting message (e.g., a SIP INVITE, message) including statistics relating to the call quality to the call control server 112. The call control server 112 may then determine a quality of data transfer between the media terminating devices 102 and 104 through the intermediary links in the system 100.

The media terminating devices 102 and 104 may implement tools to generate reports and to estimate a quality of calls. For example, the RTP control protocol (RTCP) can be used to provide feedback on the quality of data transmission. RTCP is described in Schulzrinne et al., entitled "RTP: A Transport Protocol for Real-Time Applications," IETF (RFC) 3550, July 2003, which is entirely incorporated by reference herein, as if fully set forth in this description.

The media terminating devices 102 and 104 may provide quality reports using RTCP report packets that may be in many forms including a sender report (SR) or a receiver report (RR). The SR is issued if a sending device has sent any data packets during the interval since issuing the last report or the previous one, otherwise the RR is issued. Both the SR and RR forms include zero or more reception report blocks, one for each synchronization source from which the receiving device has received RTP data packets since the last report. Each reception report block provides statistics about data received from a particular source indicated in that block. The statistics may include timestamps of when data packets were received, number of data packets received, number of data packets sent, inter-arrival jitter time, delay since last SR was sent, and others. The media terminating devices can then measure a quality of a call by analyzing these statistics using sequence numbers and time stamps contained in the data packets.

After determining a quality of the call, the media terminating devices 102 and 104 or the call control server 112 may adjust the data compression rates based on the quality of the call, as shown at block 706. The compression format can be adjusted without putting the call on hold. A user may not notice a difference during the data compression adjustment except for an improved voice quality. Messaging used to request a change in data compression depends on the call signaling protocol used. In the case of the SIP, a call setup message (e.g., INVITE message) can be sent to adjust the data compression technique.

Figure 8:
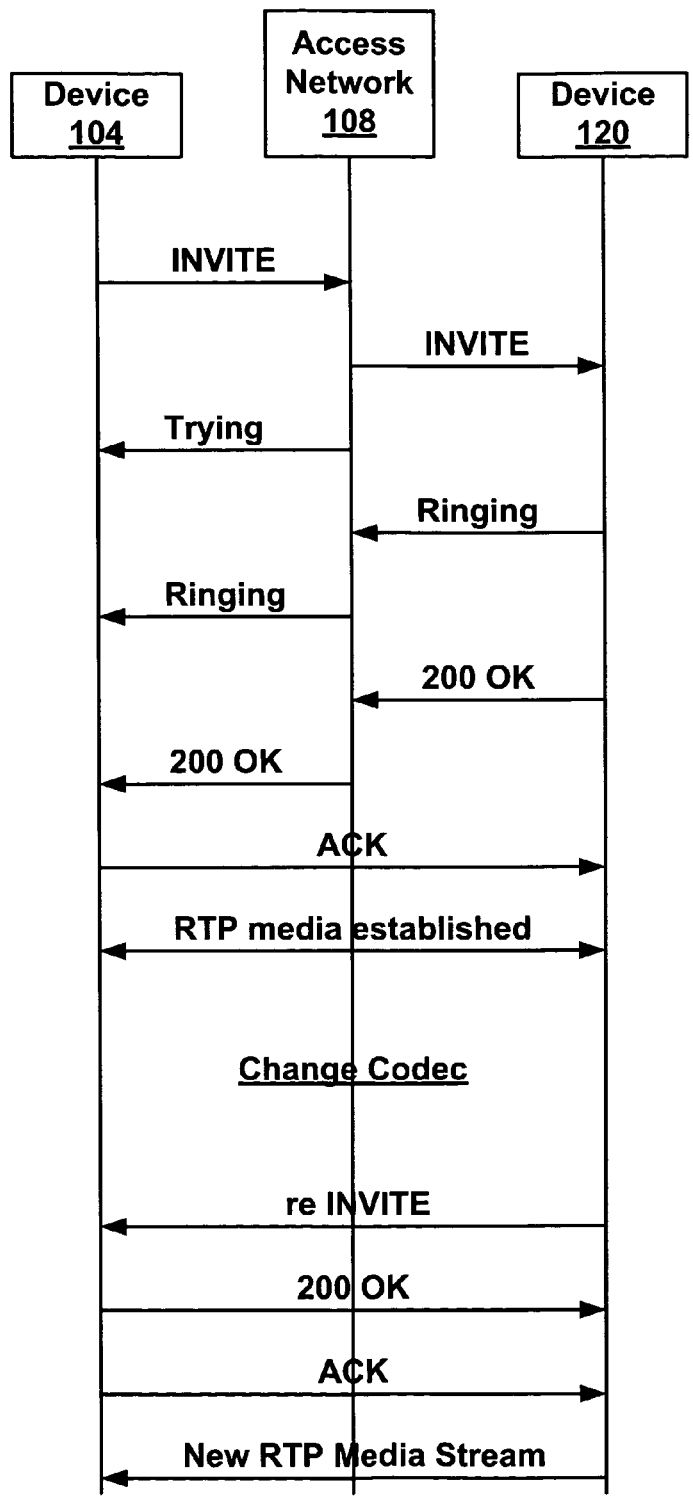
FIG. 8 illustrates one embodiment of signaling to adjust a data compression technique for data transfer between network devices.

FIG. 8 illustrates one embodiment of signaling to adjust the data compression technique. FIG. 8 illustrates call setup followed by adjustment of data compression. To setup a call using SIP, media terminating device 104 sends an INVITE message to the access network 108, which forwards the message to the media terminating device 120. Following, the access network 108 will notify media terminating device 104 that the access network 108 is attempting to contact the media terminating device 120. The media terminating device 120 will return a ringing notification to the access network 108 upon receiving the INVITE message, and the access network 108 will forward the ringing message to the media terminating device 104. Once a user answers the media terminating device 120, for example, the media terminating device 120 will send a 200 OK message to the access network 108, which forwards the 200 OK message to media terminating device 104. The media terminating device 104 will then send an ACK message to the media terminating device 120 and an RTP media session is established.

Subsequently, suppose media terminating device 120 determines that the data compression technique needs to be adjusted. The media terminating device 120 then sends an INVITE message to the media terminating device 104. This INVITE message is referred to as a "re-INVITE" message. The re-INVITE message will contain information corresponding to the new data compression technique. The media terminating device 104 will send a 200 OK message and an ACK message to the media terminating device 120 in response to the re-INVITE message. Then, the media terminating devices 104 and 120 would transfer data through an RTP media stream according to the selected compression technique.

Alternatively, the call control server 112 may receive the reports generated by the media terminating devices 120 and 104 and then determine that the data compression technique for data transfer between the media terminating devices 120 and 104 should be adjusted. The call control server 112 may then signal to the media terminating devices 120 and 104 to inform them of the new compression format.

The call control server 112 or the network devices may select a data compression technique to be used during a call based on many types of information or using many different techniques. Below are a few examples. However, it should be understand that many other equivalent techniques exist as well, and those described below are only exemplary.

In one embodiment, the call control server 112 or the media terminating devices 104 and 120 may use existing call log information (such as that shown above in Table 3 or Table 4) to determine optimum data compression techniques for data transfer between two network devices. Similar to above, the call control server 112 and the network devices may have access to a call history database (such as the database 114) that includes information relating to prior calls between the two communicating network devices. Rather than accessing the database during call setup, the call control server 112 or the network devices could access the database during the call so that call setup would not be delayed, for example.

In addition, the call control server 112 or the network devices may monitor call connection performance (or data transfer rates) and may adjust the data compression to conform to the performance that the connection is providing at any given moment. For example, call performance parameters such as delay, jitter, and compression ratio can be measured in real time for a call. If the data transfer has an unacceptable delay, or if the network provides various latency for different data packets, then the data compression technique may need to be adjusted. As one particular example, if data transfer rates are unacceptably slow during the call, then the data may be compressed at a higher level, so that smaller sized data packets are being transferred to relieve stress on the network and open up additional bandwidth for faster data transfer.

Smart Network Device Feedback

Figure 9:
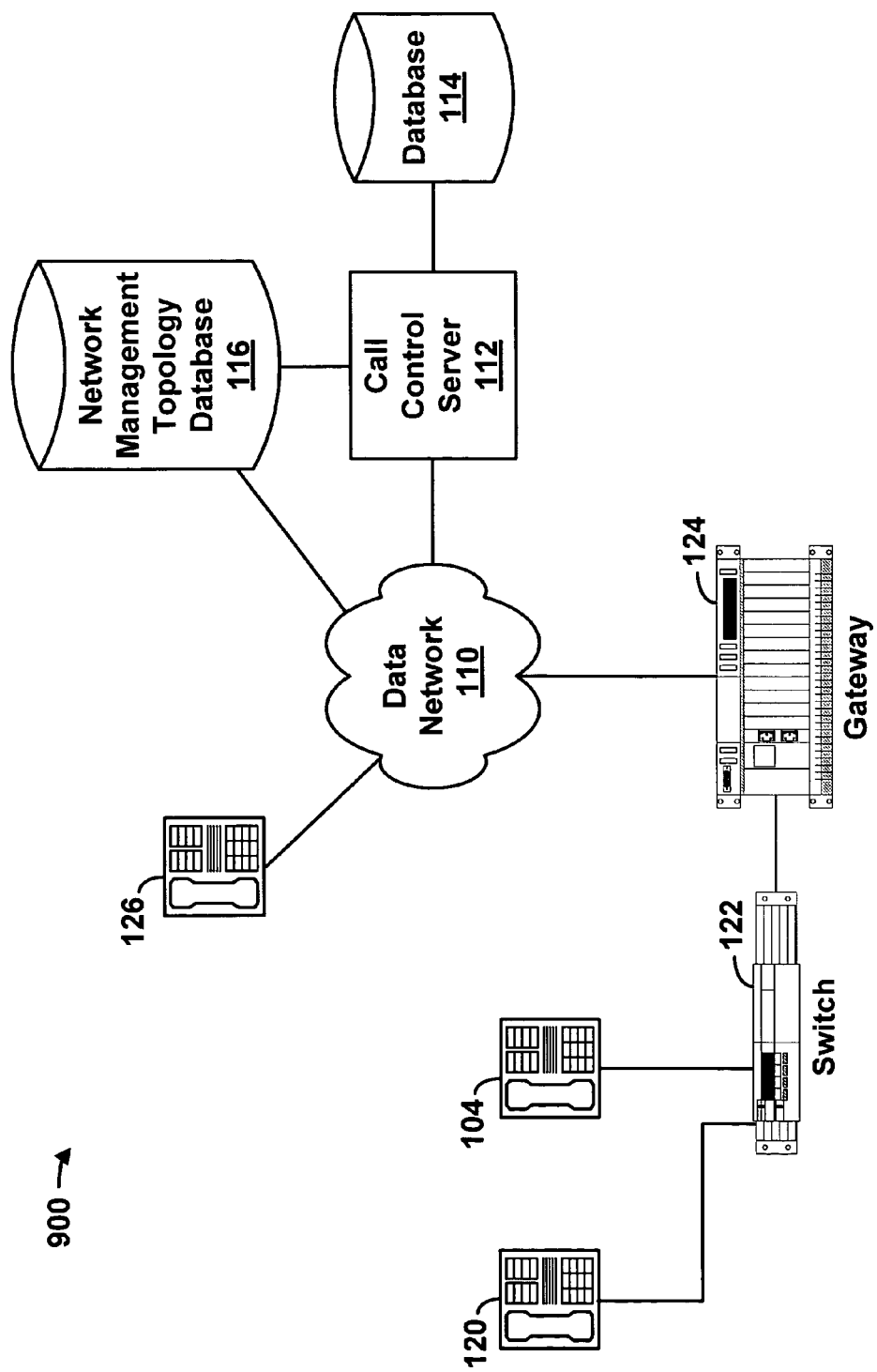
FIG. 9 is a block diagram illustrating one embodiment of a system including smart network device feedback.

In another embodiment, smart network devices (e.g., bridges or routers) may inform the call control server 112 or the network devices that the data compression technique should be adjusted. FIG. 9 is a block diagram illustrating one embodiment of a system 900 including smart network device feedback. The system 900 is similar to the system 600 in FIG. 6, except that the media terminating devices 104 and 120 are coupled to the data network 110 through a switch 122 and a gateway 124, and a third media terminating device 126 is connected to the data network. The switch 122 and the gateway 124 both help to ensure that data is sent to a desired destination. In addition, the switch 122 and the gateway 124 may identify if the data was being transferred over a slow link without data compression, for example, and then notify the call control server 112 that the source/destination address pair was transferring data with no compression over a slow link. As another example, if data was compressed and then transferred between two addresses or subnets that are known to be interconnected with high speed links, then the call control server 112 could be notified that the source/destination subnet pair was using compression over high speed links when compression may not be necessary.

Thus, the switch 122 and the gateway 124 operate as smart network devices in a sense that the switch 122 and the gateway 124 can monitor data transfer between network devices and determine whether to adjust a data compression technique for the data transfer. For example, the switch 122 would transfer data directly between the media terminating devices 104 and 120. The switch 122 would determine that both devices 104 and 120 reside on itself, and thus if the switch 122 observes compressed data being transferred then the switch 122 could inform the devices 104 and 120 that data compression is unnecessary because both devices 104 and 120 reside on the same switch.

Alternatively, if the media terminating device 120 was communicating with the media terminating device 126, then data would be transferred through the gateway 124 and the data network 110. As a result, the data may need to be compressed since the data network 110 may not have unlimited bandwidth available. Thus, the gateway 124 may monitor the data transfer to determine if the data is sufficiently compressed. If the gateway 124 determines that the compression technique should be adjusted, the gateway 124 would inform the media terminating devices 120 and 104 to change their codecs as described in FIG. 8.

The smart devices could also send reporting messages to the call control server 112 to be stored and used to select data compression techniques for future calls. In this manner, the call control server 112 could identify during call setup that media terminating devices 120 and 104 reside on the same switch, and that no data compression is necessary for the data transfer between these devices.

Thus, during the call, network equipment or smart devices may determine that data should or should not be compressed for data transfer through the smart devices. The smart network devices may also recognize when individual links become stressed or that bandwidth has become limited, and the network equipment could then inform the network devices or the call control server 112 to force data compression.

It is intended that the foregoing detailed description be regarded as illustrative rather than limiting, and it is intended to be understood that the following claims including all equivalents define the scope of the invention.

What is claimed is:

1. A method for selecting a data compression technique for data transfer through a network between a first Internet Protocol (IP) network phone and a second IP network phone, the method comprising:
   a call control server receiving, from the first IP network phone, a request to place a call to the second IP network phone;
   the call control server accessing a network database to retrieve information regarding a network topology of the network between the first IP network phone and the second IP network phone, wherein the information regarding the network topology comprises information that identifies a plurality of data transfer paths between the first IP network phone and the second IP network phone;
   the call control server identifying, from among the plurality of data transfer paths identified within the network database, a particular data transfer path between the first IP network phone and the second IP network phone;
   the call control server identifying multiple intermediary links in the particular data transfer path;
   the call control server identifying a respective maximum transfer speed for each of the multiple intermediary links and a slowest transfer speed of the respective maximum transfer speed for each of the multiple intermediary links; and
   the call control server selecting the data compression technique for data transfer through the network between the first IP network phone and the second IP network phone based on the slowest identified transfer speed of a link within the multiple intermediary links.

2. The method of claim 1, further comprising:
   the call control server determining a configuration of the network between the first IP network phone and the second IP network phone.

3. The method of claim 1, further comprising:
   the call control server determining a speed of data transfer through the particular data transfer path between the first IP network phone and the second IP network phone.

4. The method of claim 3, wherein selecting the data compression technique is further based on the speed of data transfer through the particular data transfer path.

5. The method of claim 1, wherein the method is performed during call setup for the call placed from the first IP network phone to the second IP network phone.

6. The method of claim 1, wherein the method is performed during the call placed from the first IP network phone to the second IP network phone, but after the call is set up.

7. The method of claim 1, further comprising:
the call control server receiving information regarding a time of day,
wherein selecting the data compression technique for data transfer through the network between the first IP network phone and the second IP network phone is further based on the time of day.

8. The method of claim 1, wherein selecting the data compression technique for data transfer through the network between the first IP network phone and the second IP network phone comprises selecting a data compression technique from the group consisting of G.711, G.726 and G.729.

9. The method of claim 1, wherein selecting the data compression technique for data transfer through the network between the first IP network phone and the second IP network phone is further based on total available bandwidth in the network, an instantaneous available bandwidth in the network, or an administration control of bandwidth in the network.

10. The method of claim 1, wherein retrieving the information regarding the network topology comprises retrieving the information using a Session Initiation Protocol (SIP) signaling protocol.

11. A non-transitory computer readable medium device having stored therein instructions for causing a central processing unit to execute the method of claim 1.

12. The method of claim 1, further comprising:
the call control server estimating a transfer speed within the particular intermediary link,
wherein selecting the data compression technique for data transfer through the network between the first IP network phone and the second IP network phone based on the slowest transfer speed of a link within the multiple intermediary links comprises selecting a data compression technique that can accommodate the estimated transfer speed within the particular intermediary link.

13. The method of claim 1, wherein selecting the data compression technique comprises selecting (i) a Pulse Code Modulation of Voice Frequencies technique that conforms to Recommendation G.711, (ii) an adaptive differential pulse code modulation technique that conforms to Recommendation G.726, or (iii) a Conjugate-Structure Algebraic Code Excited Linear Prediction technique that conforms to Recommendation G.729.

14. The method of claim 1, wherein the call control server determining the configuration of the network between the first IP network phone and the second IP network phone comprises the call control server determining a number of access networks used in the network between the first IP network phone and the second IP network phone and an access-network-type of each access network used in the network between the first IP network phone and the second IP network phone.

15. The method of claim 1, wherein receiving the request to place the call to the second IP network phone comprises the call control server receiving a Session Initiation Protocol (SIP) INVITE message.

16. The method of claim 15, further comprising:
prior to the call control server accessing the network database to retrieve information regarding the network topology of the network between the first IP network phone and the second IP network phone, the call control server identifying the IP addresses of the first IP network phone and the second IP network phone,
wherein the call control server identifies the IP addresses of the first IP network phone and the second IP network phone from the SIP INVITE message.

17. The method of claim 15, further comprising:
prior to the call control server accessing the network database to retrieve information regarding the network topology of the network between the first IP network phone and the second IP network phone, the call control server identifying the IP addresses of the first IP network phone and the second IP network phone,
wherein the call control server identifies the IP addresses of the first IP network phone and the second IP network phone by requesting the IP addresses from an other database and the other database responsively transmitting the IP addresses of the first IP network phone and the second IP network phone to the call control server.

18. The method of claim 1, further comprising:
the call control server sending to the first IP network telephone a message that indicates the data compression technique selected by the call control server.

19. The method of claim 18, further comprising:
the call control server sending to the second IP network telephone a message that indicates the data compression technique selected by the call control server.

20. The method of claim 18, further comprising:
during the call, the first network IP phone transmitting data to the second IP network phone according to the selected data compression technique; and
during the call, the second network IP phone transmitting other data to the first IP network phone according to the selected data compression technique.

21. The method of claim 1, further comprising:
during the call, the call control server receiving, from the first IP network phone, a reporting message including statistics relating to a quality of the call and then the call control server determining a quality of data transfer between the first IP network phone and the second IP network phone; and
the call control server adjusting the data compression technique during the call without placing the call on hold.

22. The method of claim 21, wherein the call control server transmits a SIP INVITE message to cause adjustment of the data compression technique.

23. The method of claim 21, wherein the reporting message, including statistics relating to the quality of the call, received by the call control server from the first IP network phone is arranged according to a real-time transport protocol (RTP) control protocol (RTCP).

24. The method of claim 23,
wherein the reporting message includes a reception report block with statistics about data packets received from a particular source indicated in the reception report block, and
wherein the statistics within the reception report block include statistics selected from the group consisting of timestamps of when data packets were received, a number of received data packets, an inter-arrival jitter time, and a delay since sending of a last sender report.

25. The method of claim 21, wherein the reporting message, including statistics relating to the quality of the call, received by the call control server from the second IP network phone is arranged according to a real-time transport protocol (RTP) control protocol (RTCP).

26. The method of claim 1, wherein the call control server accesses the network database to retrieve the information regarding a network topology of the network between the first IP network phone and the second IP network phone using a simple network management protocol (SNMP).

* * * * *